United States Patent [19]

Ozaki

[11] Patent Number: 5,159,417
[45] Date of Patent: Oct. 27, 1992

[54] SEMICONDUCTOR DEVICE HAVING SHORT CHANNEL FIELD EFFECT TRANSISTOR WITH EXTENDED GATE ELECTRODE STRUCTURE AND MANUFACTURING METHOD THEREOF

[75] Inventor: Hiroji Ozaki, Hyogo, Japan

[73] Assignee: Mitsubishi Denki Kabushiki Kaisha, Tokyo, Japan

[21] Appl. No.: 678,636

[22] Filed: Apr. 2, 1991

[30] Foreign Application Priority Data

Apr. 16, 1990 [JP] Japan ................ 2-101023
Mar. 15, 1991 [JP] Japan ................ 3-50912

[51] Int. Cl.⁵ ........................... H01L 29/78
[52] U.S. Cl. .................... 357/23.14; 357/23.1; 357/23.3; 357/41
[58] Field of Search ........... 357/23.1, 23.3, 23.14, 357/41

[56] References Cited

U.S. PATENT DOCUMENTS

| | | | |
|---|---|---|---|
| 4,189,737 | 2/1980 | Schrader et al. | 357/23.3 |
| 4,642,881 | 2/1987 | Matsukawa et al. | 357/23.14 |
| 4,868,617 | 9/1989 | Chiao et al. | 357/23.14 |
| 4,907,041 | 3/1990 | Huang | 357/23.14 |

FOREIGN PATENT DOCUMENTS

| | | | |
|---|---|---|---|
| 53-68986 | 6/1978 | Japan | 357/23.14 |
| 61-42168 | 2/1986 | Japan | 357/23.14 |
| 62-248256 | 10/1987 | Japan | 357/23.14 |
| 63-217664 | 9/1988 | Japan | 357/23.3 |

OTHER PUBLICATIONS

IEEE Electron Device Letters, vol. 11, No. 2, Feb. 1990, "Simple Gate-to-Drain Overlapped MOSFET's Using Poly Spacers for High Immunity to Channel Hot-Electron Degradation" by Chen et al, pp. 78–81.
IBM Technical Disclosure Bulletin, vol. 30, No. 12, May 1988, "Simplified Lightyly Doped Drain Process", p. 180–181.
"The Impact of Gate-Drain Overlapped LDD (GOLD) for Deep Submicron VLSI's", IEDM Tech. Dig., 1987, pp. 38–41, Izawa et al.
"High Dielectric LDD Spacer Technology for High Performance MOSFET Using Gate-Fringing Field Effects", IEDM Tech. Dig., 1989, pp. 613–616, Mizuno et al.

Primary Examiner—Rolf Hille
Assistant Examiner—Steven Loke
Attorney, Agent, or Firm—Lowe, Price, LeBlanc & Becker

[57] ABSTRACT

A semiconductor device comprises a semiconductor substrate (1), a source region (5) and a drain region (6) a first gate electrode (4), a second gate electrode (8), an insulator layer (9) and a conductor layer (10). The semiconductor substrate (1) contains impurity of a first conductive type in a predetermined concentration. The source region (5) and the drain region (6) are formed and spaced on the main surface of the semiconductor substrate (1), and contains impurity of a second conductive type in a concentration which is 10 to $10^3$ times as large as that of the impurity of the first conductive type. The first gate electrode (4) is located between the source and drain regions (5) and (6) and formed on the main surface of the semiconductor substrate (1) with an insulating film (3) therebetween. The second gate electrode (8) is formed to have portions overlapping a portion of the source region (5) and a portion of the first gate electrode (4) with an insulating film (7) therebetween. The insulator layer (9) has an opening (20) through which surfaces of at least the first and second gate electrodes (4) and (8) are exposed. The conductor layer (10) electrically contacts the surfaces of the first and second gate electrodes (4) and (8) through the opening (20). The field effect transistor has a high current drive capacity and a high resistance to the hot carriers. The field effect transistor can have a gate length of a quarter micron order.

16 Claims, 12 Drawing Sheets

SEMICONDUCTOR DEVICE HAVING SHORT CHANNEL FIELD EFFECT TRANSISTOR WITH EXTENDED GATE ELECTRODE STRUCTURE AND MANUFACTURING METHOD THEREOF

BACKGROUND OF THE INVENTION

1. Field of the Invention

The present invention relates to a semiconductor device and a manufacturing method thereof, and more particularly to structures of field effect transistors having a short channel length and a manufacturing method thereof.

2. Description of the Background Art

In recent years, there has been rapid progress in microminiaturization of elements, which form large scale integrated circuits (LSI's), with the development of integration of semiconductor devices. As one type of element forming the semiconductor devices, there is a field effect transistor. MOS transistors having particularly short channel lengths, which are formed by microminiaturization of these field effect transistors, have such characteristics that an electric field in a channel direction remarkably increases in the proximity of the drain if the drain voltage is increased. Even if the drain voltage is constant, when the difference in the impurity concentrations between the drain region and the substrate region is large, the area of a depletion layer formed in a region therebetween becomes narrower, so that the field strength in a channel direction in the depletion layer becomes large. As a result, electrons in a channel region is accelerated by this strong field and is easily brought to a highly energized state. These highly energized electrons will collide with a grid of silicon at the proximity of the drain region to generate a large amount of electron-hole pairs in an avalanche. Among the electrons and the holes generated by this impact ionization, the electrons are attracted by a high drain field and flow into the drain region to form a part of a drain current. The holes are pushed back by the drain field and thus flow into a depletion layer below the channel region to form a part of a substrate current. In this case, the highly energized electrons generated due to the increase in field strength at the proximity of the drain have been called as hot carriers. The generation of the hot carriers adversely affect reliability of the field effect transistor.

In order to reduce the field strength at the proximity of the drain which may cause generation of the hot carriers, conventionally, field effect transistors having LDD (Lightly Diffused Drain) structures have been proposed and practically utilized. FIG. 16 is a sectional view of an n-channel MOS transistor having the LDD structure. Referring to FIG. 16, a p-type silicon substrate 31 has a gate electrode 33 formed thereon with a gate oxide film 32 therebetween. A sidewall oxide film 34 is formed on the side walls of the gate electrode 33. On opposite sides of the gate electrode 33 are formed n-type impurity regions as source region/drain region. These n-type impurity regions include $n^-$ impurity regions 35a and 35b in a low concentration and $n^+$ impurity regions 36a and 36b in a high concentration. The $n^-$ impurity regions 35a and 35b in a low concentration are formed on the silicon substrate 31 just below the sidewall oxide film 34. The $n^+$ impurity regions 36a and 36b are formed in a region away from the gate electrode 33, extending to be connected to the $n^-$ impurity regions 35a and 35b, respectively. In this manner, there are formed source/drain regions including the $n^-$ impurity regions 35a and 35b in a low concentration at the proximity of the channel region. When either of the $n^-$ impurity regions 35a and 35b having the low concentration is used as the drain, the field strength at the proximity of the drain is reduced. That is, as the difference in the impurity concentrations between the $n^-$ impurity region 35a and the region of the p-type silicon substrate 31 is small, an area of a depletion layer formed in a region therebetween becomes wide when the $n^-$ impurity region 35a having a low concentration is used as a drain. Therefore, the field strength in a channel direction, i.e., the field strength in the proximity of the drain is reduced.

In the n-channel MOS transistor having the LDD structure shown in FIG. 16, it is assumed that the drain region is formed of the $n^-$ impurity region 35a and $n^+$ impurity region 36a. It is further assumed that the source region is formed of the $n^-$ impurity region 35b and $n^+$ impurity region 36b. Suppose that application of a predetermined voltage to the gate electrode 33 causes the electrons as the carriers to move in a direction indicated by an arrow of a solid line in the channel region. In this case, even if the drain region near the channel is formed by the $n^-$ impurity region 35a having a low concentration, the impact ionization causes the electron-hole pairs. Among them, the electrons indicated with circled "−" in the figure are trapped by the sum of the drain field and the field caused by the gate electrode at the lower part of the sidewall oxide film 34. The trapping of the electrons in the sidewall oxide film 34 causes depletion of the carrier on the substrate surface in the $n^-$ impurity region 35a. This increases the resistance of the $n^-$ impurity region 35a with the passage of time. It can be thereby presumed that the carriers moving in the direction indicated by the arrow of a solid line in the channel region do not flow into the $n^-$ impurity region 35a but flow under the $n^-$ impurity region 35a as indicated by an arrow of a dashed line and then into the $n^+$ impurity region 36a. As a result, a threshold value Vth of the gate voltage is caused to increase and there is caused decrease in a current drive capacity, i.e., deterioration of a current gain $\beta$.

Various improved LDD structures have been proposed so as to prevent a device deterioration phenomena peculiar to conventional field effect transistors having the LDD structures and thus to improve the resistance to the hot carrier. A field effect transistor having a GOLD (Gate-Overlapped-LDD) structure as one of such improved LDD structures has been proposed in "THE IMPACT OF GATE-DRAIN OVERLAPPED LDD (GOLD) FOR DEEP SUBMICRON VLSI'S" IEDM Tech. Dig. 1987, pp. 38-41. FIG. 17 is a sectional view of an n-channel MOS transistor having the GOLD structure. Referring to FIG. 17, a gate electrode 37 is formed of polysilicon over the p-type silicon substrate 31 with the gate oxide film 32 therebetween. An oxide film 39 is formed on the gate electrode 37 by a CVD method. A sidewall oxide film 40 is formed on the sidewalls of the gate electrode 37. Source and drain regions formed on opposite sides of the electrode 37 include $n^-$ impurity regions 35a, 35b having a low concentration and $n^+$ impurity regions 36a and 36b having a high concentration. Ends 37a of the gate electrode 37 in the channel direction are respectively formed just above the $n^-$ impurity regions 35a and 35b having the low concentration with the gate film 32 therebetween.

Selective oxide films 41 are formed to connect to the ends 37a of the gate electrode. Due to requirement in a manufacturing process, a natural oxide film 38 is located in the gate electrode 37 so as to form the ends 37a of the gate electrode extending just above the n⁻ impurity regions 35a and 35b.

According to this GOLD structure, the n⁻ impurity region to be the drain region is formed to be located just below the gate electrode. Thus, a peak position of the field strength in the proximity of the drain is located just below the gate electrode. Therefore, on applying a predetermined voltage to the gate electrode, the electric field by the gate is applied to the n⁻ impurity regions. Consequently, even if the electrons generated by the impact ionization flow into the gate oxide film interposed between the gate electrode and the n⁻ impurity regions, there will be no depletion of the carriers on the substrate surface in the n⁻ impurity regions because the field by the gate electrode will attract the electrons. This can prevent the reduction of the current drive capacity, i.e., deterioration of the current gain $\beta$.

However, the field effect transistor having the above-described GOLD structure requires formation of n⁻ impurity regions in the low concentration as the source/drain regions inside the gate electrode. In other words, it is necessary to form a structure in which the n⁻ impurity regions forming part of the source/drain regions, and part of the gate electrode are completely overlapped with each other. This structure requires a complicated manufacturing process.

FIGS. 18 to 21 are cross-sectional views showing a manufacturing method of an n-channel MOS transistor having the GOLD structure shown in FIG. 17 in order of process. Referring to FIG. 18, a gate oxide film 32 is formed on a p-type silicon substrate 31. A first polysilicon layer 371 is formed on this gate oxide film 32, having a thickness of 50 nm. After that, a natural oxide film 38 is grown on the first polysilicon layer 371, having a thickness of 5 to 10 Å by air curing of the wafer. A second polysilicon layer 372 is formed on this natural oxide film 38. An oxide film 39 is formed on the second polysilicon layer 372 in accordance with a predetermined pattern by the CVD method.

Referring to FIG. 19, an isotropic dry etching treatment having a high selectiveness is applied to the second polysilicon layer 372, using the oxide film 39 as a mask. The second polysilicon layer 372 is etched such that it is scraped in the portion under the oxide film 39 to form a gate electrode 37, the first polysilicon layer 371 remaining with its surface exposed on opposite sides of the oxide film 39. After that, phosphorus ions having a high energy of about 80 keV are implanted as shown by the arrows, using the oxide film 39 as a mask. These phosphorus ions penetrate the thin first polysilicon layer 371 and reaches the inside of the silicon substrate 31, so that n⁻ impurity regions 35a, 35b having a low concentration are formed.

As shown in FIG. 20, a sidewall oxide film 40 is formed on opposite sides of the gate electrode 37. The first polysilicon layer 371 remaining outside of the sidewall oxide film 40 is removed by anisotropic dry etching, thereby forming an end 37a of the gate electrode.

After that, as shown in FIG. 21, a selective oxide film 41 is formed to be connected to the end 37a of the gate electrode. At last, n⁺ impurity regions 36a, 36b are formed by implanting arsenic ions outside of the sidewall oxide film 40, using the oxide films 39 and 40 as a mask. In this way, a field effect transistor having the GOLD structure is manufactured.

In the manufacturing process shown in the description above of FIG. 19, however, isotropic dry etching is used to cause the thin first polysilicon layer 371 to remain with the surface being exposed. At this time, it is necessary to stop the isotropic etching halfway. It is extremely difficult to effect the control of the completion of this isotropic etching, using the natural oxide film 38. Furthermore, it is extremely difficult to control the amount of etching of the second polysilicon layer 372 in the lateral direction by using isotropic etching so as to accurately provide an effective channel length Leff.

Further, if the gate length decreases to about a quarter micron (0.25 μm) or below with the microminiaturization of the field effect transistor, an effective channel length Leff shown in FIG. 17 will become extremely short. Therefore, it will be difficult to stably form the n⁻ impurity regions 35a and 35b, which form part of the source/drain regions, just below the ends 37a of the gate electrode. That is, the amount of the overlapping portion between the n⁻ impurity regions 35a, 35b and the ends 37a of the gate electrode depends on the isotropic etching process of the second polysilicon layer 372 shown in FIG. 19 and the ion-implantation process conducted through the thin first polysilicon layer 371. Therefore, the size of the n⁻ impurity regions 35a, 35b formed by the ion-implantation is controlled by the amount of etching of the second polysilicon layer 372. Since it is difficult to accurately control the amount of etching in the lateral direction in isotropic etching, it is difficult to control the short effective channel length Leff and the size of the n⁻ impurity regions 35a, 35b at a desired value in a stable manner.

Therefore, as long as the GOLD structure is employed, it is difficult to implement a field effect transistor having a gate length of a quarter micron order.

SUMMARY OF THE INVENTION

An object of the invention is to provide a field effect transistor having a gate length of a quarter micron order.

Another object of the invention is to provide a microminiaturized field effect transistor having a high current drive capacity.

Still another object of the invention is to provide a field effect transistor having a structure highly resistant to hot carriers.

A further object of the invention is to provide a field effect transistor whose effective channel length is not reduced with the reduction of gate length.

A still further object of the invention is to form a field effect transistor capable of obtaining a high channel conductance with a low impurity dose.

A semiconductor device in accordance with one aspect of the invention includes a semiconductor substrate, a source region and a drain region, a first insulating film, a first gate electrode, a second insulating film, and a second gate electrode. The semiconductor substrate includes a main surface and impurity of a first conductive type. The source/drain regions are formed on opposite sides of a channel region in the main surface of the semiconductor substrate and have impurity of a second conductive type. The first insulating film is formed on the main surface of the semiconductor substrate over the channel region. The first gate electrode is formed on the first insulating film over the channel region. The second insulating film is formed on a side surface of the first gate electrode adjacent to the source region and on the main surface of the semiconductor substrate over the source region. The second gate electrode is formed on the second insulating film over the source region and electrically connected to the first gate electrode.

A semiconductor device according to another aspect of the invention includes a semiconductor substrate, a source region and a drain region, a first insulating film, a first gate electrode, a second insulating film and a second gate electrode. The semiconductor substrate has a main surface and includes impurity of a first conductive type. The source region and the drain region are formed in the main surface of the semiconductor substrate and on opposite sides of the channel region and include impurity of a second conductive type. The first insulating film is formed on the main surface of the semiconductor substrate over the channel region and has a first thickness. The first gate electrode is formed on the first insulating film over the channel region. The second insulating film is formed on the main surface of the semiconductor substrate over the source region and has a second thickness smaller than the first thickness. The second gate electrode is formed on the second insulating film over the source region and is electrically connected to the first gate electrode.

In accordance with a manufacturing method of a semiconductor device according to the invention, at first, a first insulating film is formed on a main surface of a semiconductor substrate over a channel region. A first gate electrode is formed on the first insulating film over the channel region. Impurities are implanted into the main surface of the semiconductor substrate using the first gate electrode as a mask. A source region and a drain region containing impurity of a second conductive type are thereby formed in the main surface of the semiconductor substrate and on opposite sides of the first gate electrode. A second insulating film is formed on a side surface of the first gate electrode adjacent to the source region and on the main surface of the semiconductor substrate over the source region. The second gate electrode is formed on the second insulating film over the source region to be electrically connected to the first gate electrode.

The semiconductor device according to another aspect of the invention comprises a semiconductor substrate, source and drain regions, a first gate electrode, a second gate electrode, an insulator layer, and a conductor layer. The semiconductor substrate has a main surface and contains impurity of a first conductive type in a predetermined concentration. The source and drain regions are formed on the main surface of the semiconductor substrate and spaced from each other, and contain impurity of a second conductive type in a concentration which is 10 to $10^3$ times as large as that of the impurity of the first conductive type. The first gate electrode is located between the source and drain regions on the main surface of the semiconductor substrate with an insulating film therebetween. The second gate electrode is formed to have portions overlapping a portion of the source region and a portion of the first gate electrode with an insulating film therebetween. The insulator layer is formed on the main surface of the semiconductor substrate and has an opening through which surfaces of at least the first and second gate electrodes are exposed.

In the present invention, the first gate electrode and the second gate electrode are electrically connected together. Thus, voltage is applied to the second gate electrode at the same time a predetermined voltage is applied to the first gate electrode. Thereby, an electric field by the first gate as well as an electric field by the second gate are generated. The field by the second gate attracts the carriers toward the surface of the semiconductor substrate at a portion in the source region with the insulating film just below it. As a result, this source region becomes a region having a higher apparent carrier concentration. In other words, a resistance in the source region can be reduced. This results in improvement of a current drive capacity, i.e., a current gain of the field effect transistor.

Since the drain region is composed of the impurity region having the low concentration, similarly to the LDD structure, the resistance to the hot carriers can be made high. In other words, the field is relieved in the proximity of the end of the drain region, and the impact ionization can be suppressed.

Further, neither source region nor drain region is formed inside the first gate electrode which is formed corresponding to a predetermined effective channel length. Therefore, it is possible to ensure the predetermined effect channel length, and the structures according to the invention can be applied to the field effect transistor having a gate length equal to or less than a value of a quarter micron order. Accordingly, it is possible to implement a microminiaturized field effect transistor in which the current drive capacity as well as the resistance to the hot carriers are improved.

The thickness of the second insulating film formed over the source region may be smaller than the thickness of the first insulating film formed over the channel region. In this case, when a predetermined voltage is applied to the first gate electrode and the second gate electrode, the electric field by the second gate draws more carriers to the surface of the source region compared with the case in which the first insulating film and the second insulating film have the same thickness. As a result, the current drive capacity of the field-effect transistor can be more enhanced.

In a preferred embodiment of a semiconductor device according to the invention, the source region includes a first source region which contains the impurity of the second conductive type in a concentration which is 10 to $10^3$ times as large as that of the impurity of the first conductive type, and a second source region which contains the impurity of the second conductive type in a concentration which is $10^3$ to $10^5$ times as large as that of the impurity of the first conductive type. The first source region has a portion overlapping the second gate electrode, and the second source region connects to the first source region and extends away from the second gate electrode. The drain region may be composed of a first drain region and a second drain region similarly to the source region described above. A third gate electrode may be formed to have portions overlapping a portion of the drain region and a portion of the first gate electrode with the insulating film therebetween. In this case, the conductor layer includes a portion electrically in contact with a surface of the third gate electrode through the opening.

In a preferred embodiment of a manufacturing method of a semiconductor device according to the invention, an element isolation region may be formed on the main surface of the semiconductor substrate. The source region and the drain region are formed on the main surface of the semiconductor substrate between the element isolation region and the first gate electrode. After an insulating film is formed to cover the surfaces of the first gate electrode and the source region, the second gate electrode is formed on the insulating film.

According to the invention, as described above, the second gate electrode can advantageously and effectively increase the concentration of the carriers in the surface of the source region. A high channel conductance can be thereby obtained with a low impurity dose, resulting in improvement of the current drive capacity. Further, the drain region has the impurity concentration substantially similar to that in the LDD structure, and thus has the high resistance to the hot carriers. Further, even in the field effect transistor having the gate length equal to or less than a value of a quarter micron order, the effective channel length is not reduced to a length shorter than it. Therefore, in the microminiaturized field effect transistor, the resistance to the hot carriers can be increased and the current drive capacity can also be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
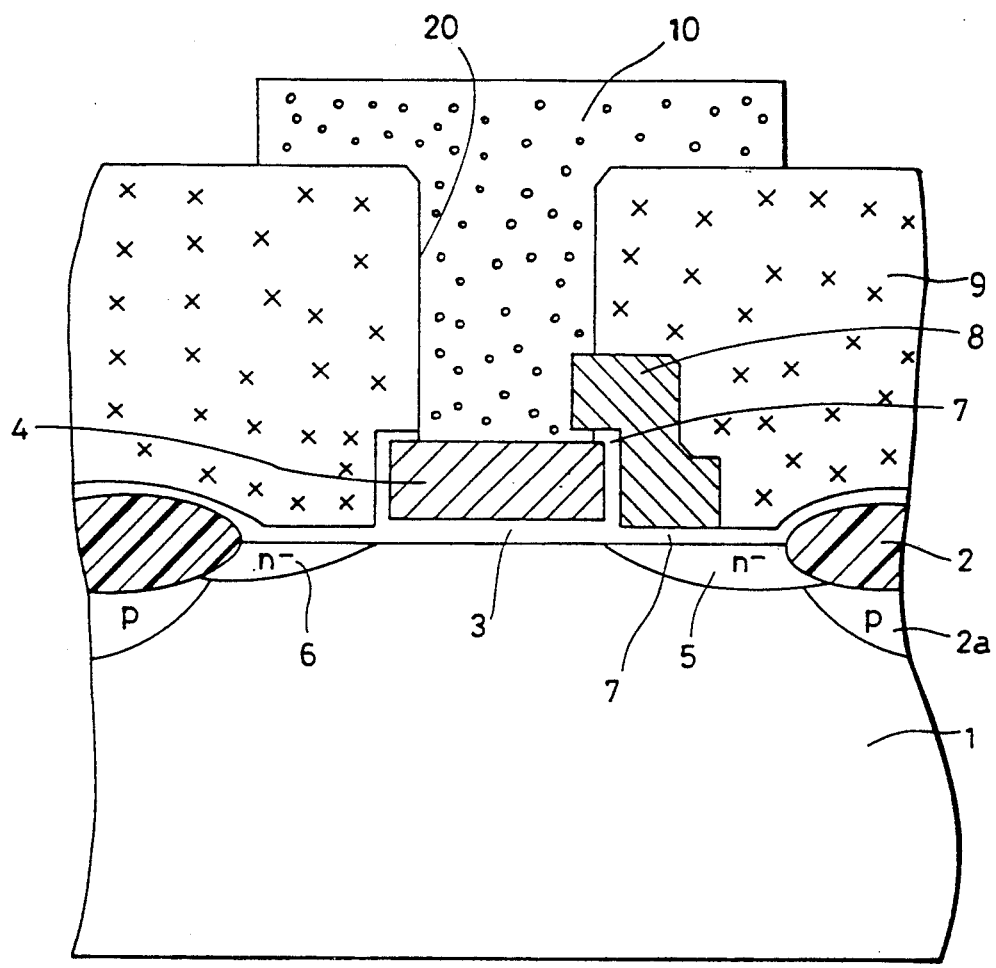
FIG. 1 is a sectional view illustrating structures of a n-channel MOS transistor according to an embodiment of the invention.

Referring to FIG. 1, there is shown a p-type well layer or p-type silicon substrate 1 on which thick isolation oxide film 2 formed by LOCOS method for element isolation is formed with a predetermined space between each other. A p-type impurity region 2a as a channel stopper region is formed under the isolation oxide film 2. The isolation oxide film 2 surrounds an active region in which a first gate electrode 4 is formed over the p-type silicon substrate 1 with a first gate insulating film 3 therebetween. An $n^-$ source region 5 and an $n^-$ drain region 6 are formed between the first gate electrode 4 and the isolation oxide film 2. A second gate insulating film 7 is formed on the sidewall of the first gate electrode 4. A second gate electrode 8 is formed above the first gate electrode 4 and over the $n^-$ source region 5 with the second gate insulating film 7 therebetween. Thus, the second gate electrode 8 is formed to overlap a portion of the $n^-$ source region 5. A layer insulating film 9 is formed above the p-type silicon substrate 1. The layer insulating film 9 is provided with a contact hole 20 apertured to expose surfaces of at least the first gate electrode 4 and the second gate electrode 8. A gate wired electrode 10 is formed to electrically come in contact with the first and second electrodes 4 and 8 through the contact hole 20.

In the n-channel MOS transistor thus constructed according to the invention, when a predetermined voltage is applied to the gate wired electrode 10, voltage is applied to the first and second gate electrodes 4 and 8. A field caused by the first gate electrode 4 thereby attracts carriers to a channel region just below the first gate electrode 4. Simultaneously, electrons, as carriers, are attracted also to the surface of the $n^-$ source region 5 just below the second gate electrode 8. The $n^-$ source region 5 thereby becomes a source region having a higher apparent carrier concentration. Thus, this $n^-$ source region 5 functions as if it has a dose of impurity larger than the actual dose. Therefore the n-channel MOS transistor as a whole can be provided with a high channel conductance, i.e., a high current drive capacity with the low impurity dose.

Since the drain region has an $n^-$ impurity concentration of $10^{17}$–$10^{19}$/cm$^3$ substantially similar to that of the LDD structure, it has a high resistance to the hot carriers generated near the end of the drain region. That is, the $n^-$ impurity region forming the drain region acts to suppress the impact ionization.

In the n-channel MOS transistor shown in FIG. 1, the region in the p-type silicon substrate 1 just below the first gate electrode 4 acts as the channel region. Therefore, even if the gate length of the first gate electrode 4 is reduced to a length less than or equal to a quarter micron order, an effective channel length Leff is not reduced to a length less than the gate length. This ensures a margin with respect to punching-through involved in the reduction of the gate length.

A manufacturing method of the n-channel MOS transistor shown in FIG. 1 will be described below.

Figure 2:
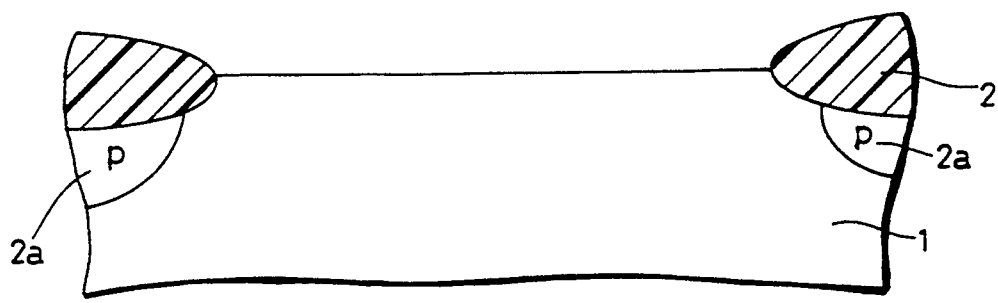
FIGS. 2, 3, 4, 5, 6, 7 and 8 are sectional views illustrating manufacturing steps of the n-channel MOS transistor shown in FIG. 1 in a processing order.

Referring to FIG. 2, the p-type silicon substrate 1 contains the impurity of p-type such as boron in the concentration of $10^{16}$–$10^{18}$/cm$^3$. The isolation oxide films 2 are formed on the substrate 1 to have a thickness of about 5000 Å with a predetermined space therebetween. Similarly to a conventional method, p- type impurity regions 2a having a concentration of about $10^{16}$–$10^{17}$/cm$^3$ are formed as the channel stopper regions under the isolation oxide films 2.

Figure 3:
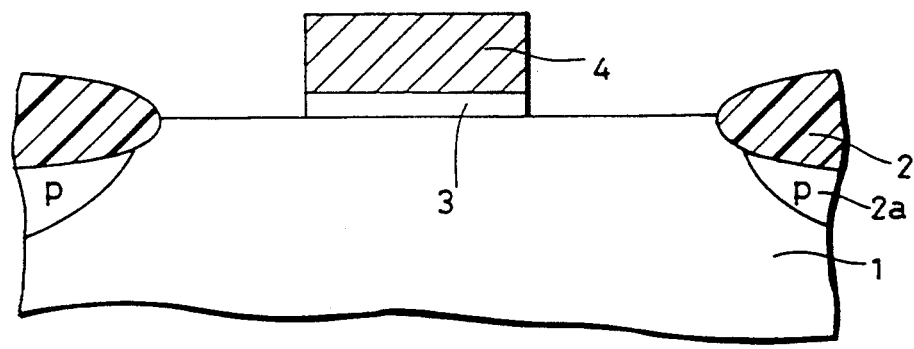

Referring to FIG. 3, a first gate insulating film 3 having a thickness of about 175–225 Å is formed on the entire surface of the p-type silicon substrate 1 by a thermal oxidation or a CVD method. A first gate electrode 4 is formed on the first gate insulating film 3 for example by doped polysilicon containing the impurity of n-type in the concentration of about $7 \times 10^{20}$/cm$^3$, using the CVD method. This first gate electrode 4 has a thickness of about 2000 Å. Thereafter, photolithography technique is utilized to effect patterning of the first gate electrode 4 and the first gate insulating film 3 to be formed as shown in FIG. 3.

Figure 4:
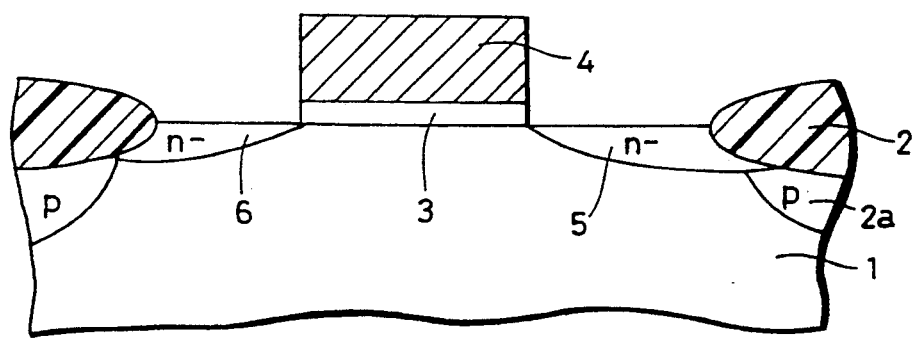

Referring to FIG. 4, arsenic ions or phosphorus ions are injected into the p-type silicon substrate 1, using the isolation oxide film 2 and the first gate electrode 4 as a mask. The n$^-$ source region 5 and the n$^-$ drain region are thereby formed to have the n- type impurity concentration of about $10^{17}$–$10^{19}$/cm$^3$. In this manner, the source region and the drain region are formed to have the impurity concentrations which are approximately 10 to $10^3$ times as large as that of the semiconductor substrate.

Figure 5:
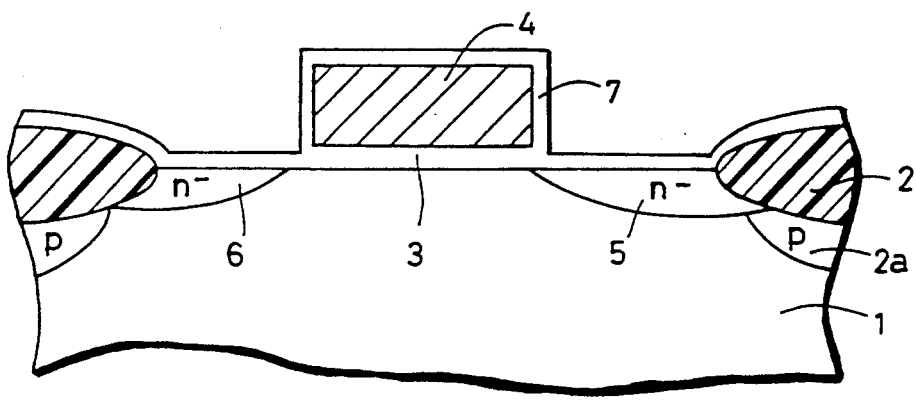

Referring to FIG. 5, a silicon oxide film constituting the second gate insulating film 7 is formed on the whole surface to have a thickness of about 100–150 Å by the thermal oxidation or the CVD method.

Figure 6:
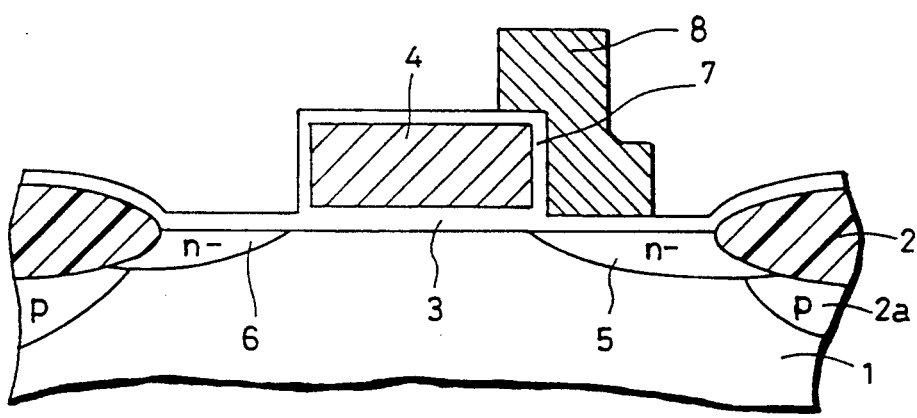

Referring to FIG. 6, a second gate electrode 8 is formed to overlap at least a portion of the first gate electrode 4 and at least a portion of the n$^-$ source region 5. This second gate electrode 8 is formed, for instance, of the doped polysilicon containing the n-type impurity in the concentration of about $7 \times 10^{20}$/cm$^3$ by the CVD method. The second gate electrode 8 has a thickness of about 2000 Å.

Figure 7:
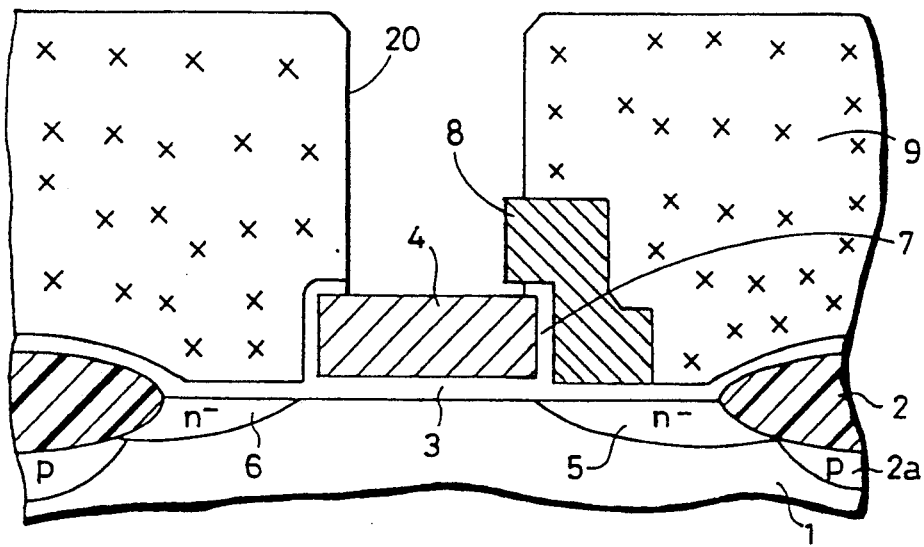

As shown in FIG. 7, a layer insulating film 9 is formed of the silicon oxide film having a thickness of about 5000 Å, e.g., by the CVD method on the whole surface. Thereafter, a contact hole 20 is formed in the layer insulating film 9 so as to expose at least the surfaces of the first and the second gate electrodes 4 and 8.

Figure 8:
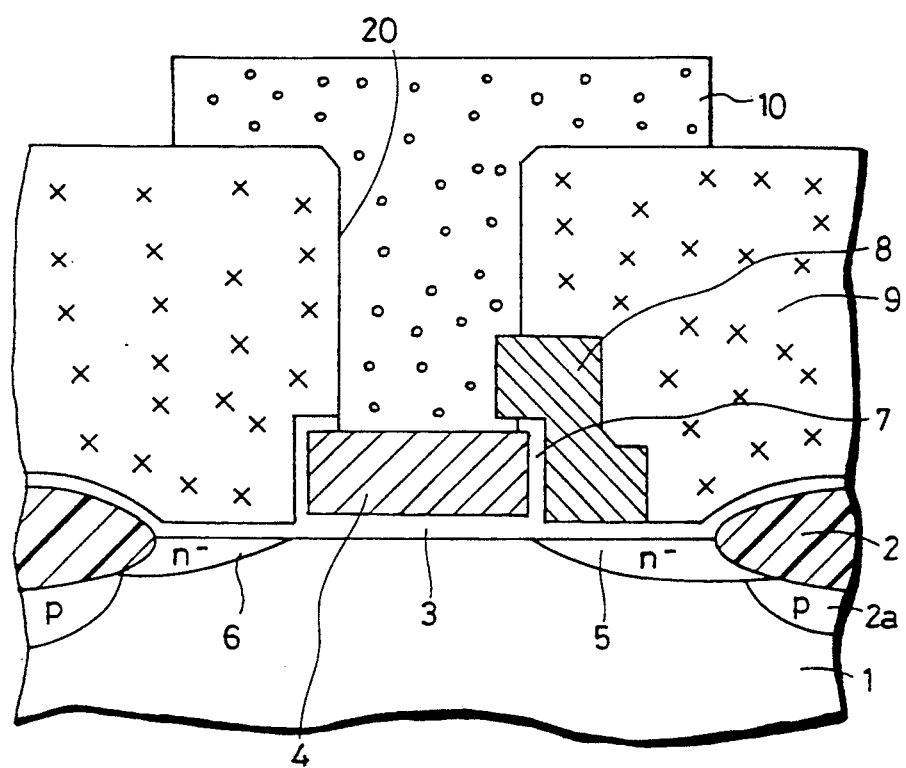

Referring to FIG. 8, a gate wired electrode 10 is formed to be electrically in contact with the first and the second gate electrodes 4 and 8 through, the contact hole 20.

Figure 9:
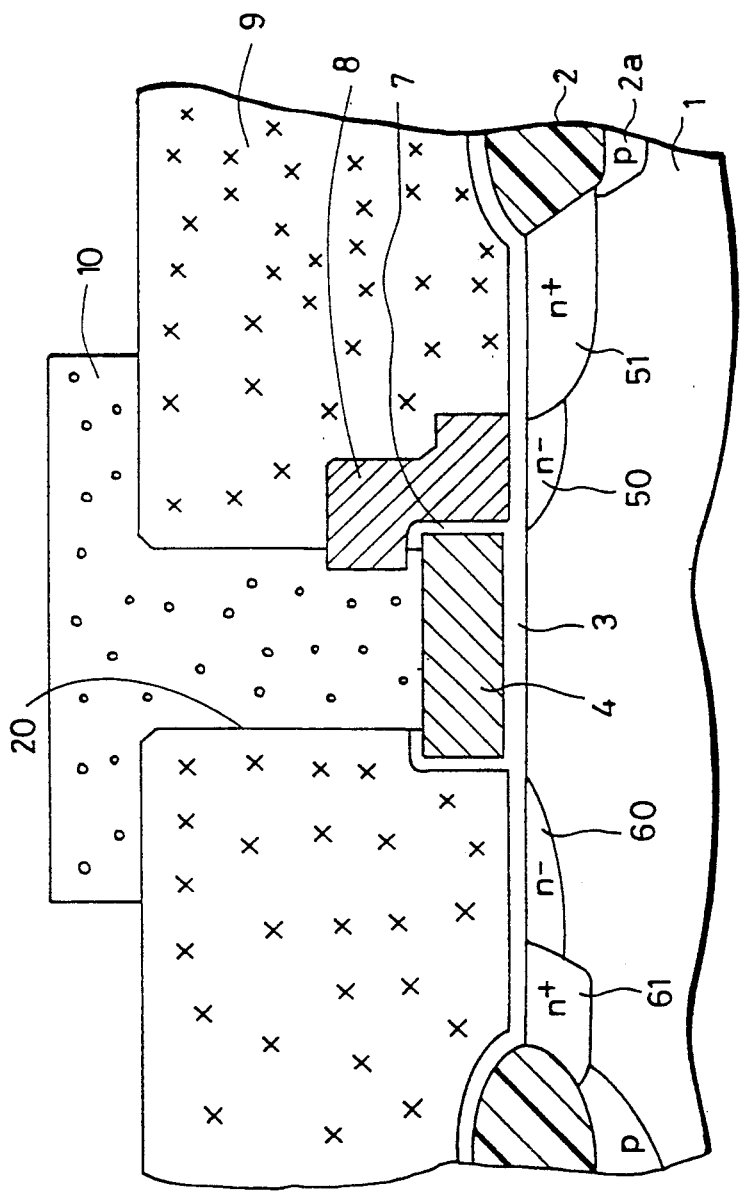
FIG. 9 is a sectional illustrating structures of a n-channel MOS transistor according to another embodiment of the invention.

Another embodiment of a n-channel MOS transistor according to the invention will be described hereinafter. Referring to FIG. 9, the source region is composed of an n$^-$ source region 50 and an n$^+$ source region 51. The drain region is composed of an n$^-$ drain region 60 and an n$^+$ drain region 61. The impurity concentration of the n$^+$ source region 51 and the n$^+$ drain region 61 is about $10^\circ$–$10^{21}$/cm$^3$. In the source region, a second gate electrode 8 is formed only just above the n$^-$ source region 50. In this embodiment, the drain region has the LDD structure. By virtue of the existence of the n source region 51 having the high concentration and connected to the n$^-$ source region 50, the current drive capacity can be further increased.

Figure 10:
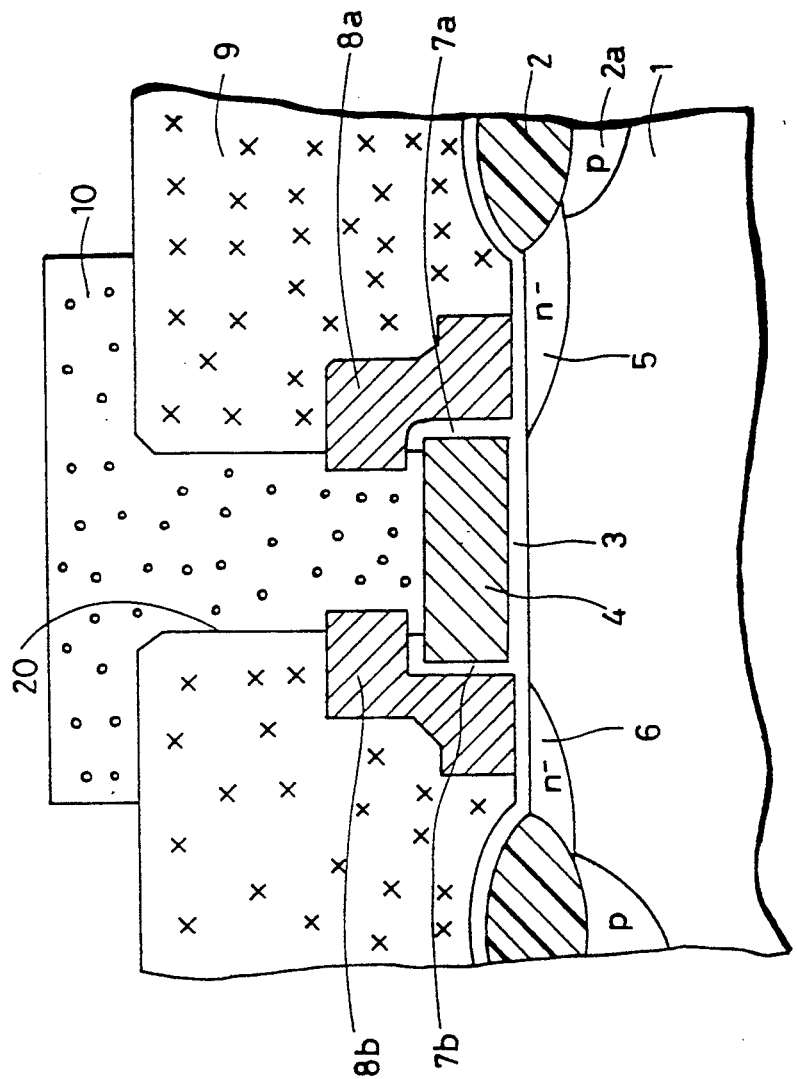
FIG. 10 is a sectional view illustrating structures of a n-channel MOS transistor according to still another embodiment of the invention.

Still another embodiment of an n-channel MOS transistor according to the invention will be described below. As shown in FIG. 10, a second gate electrode 8a is formed just above the n$^-$ source region 5, and a second gate electrode 8b is also formed just above the n$^-$ drain region 6. The second gate electrode 8a is formed on the sidewall of the first gate electrode 4 with a second gate insulating film 7a therebetween. The second gate electrode 8b is formed on the sidewall of the first gate electrode 4 with a second gate insulating film 7b therebetween. Since the second gate electrodes are formed to be just above and overlap the source region and the drain region, the n$^-$ regions 5 and 6 may be used as either the source or the drain region.

Figure 11:
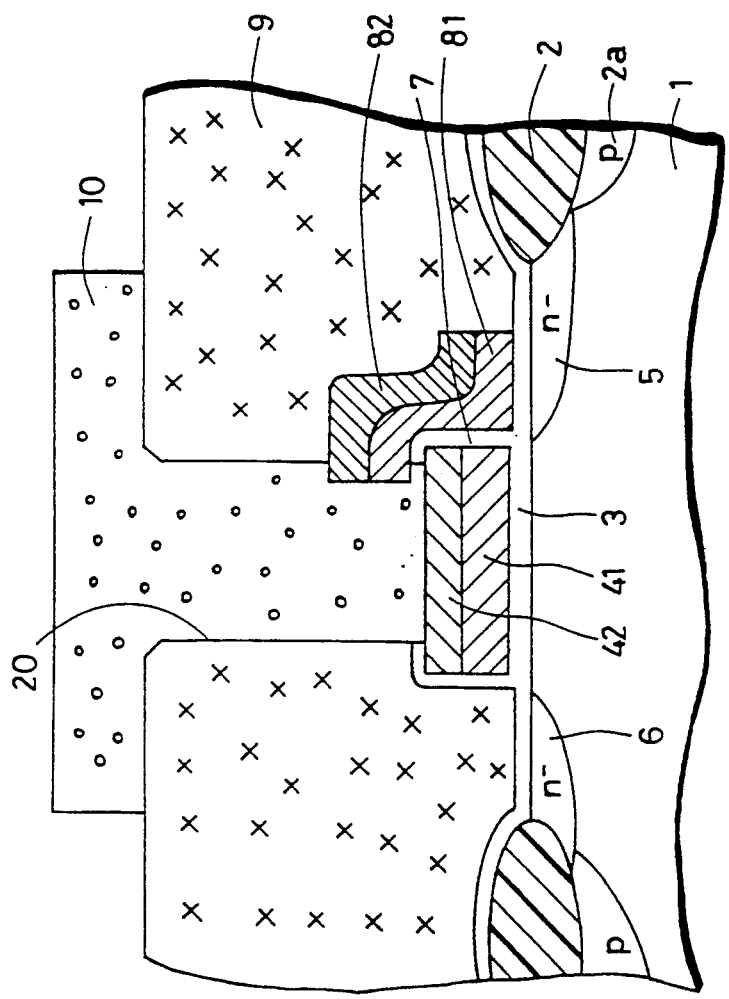
FIG. 11 is a sectional view illustrating a modified form of a structure of gate electrodes in a n-channel MOS transistor according to an embodiment of the invention.

The n-channel MOS transistor according to the invention may include gate electrodes having a structure in a modified form described below. Referring to FIG. 11, the second gate electrode is composed of a doped polysilicon layer 81 and a metal silicide layer 82 having a high melting point. The metal silicide layer 82 having a high melting point includes WSi$_2$, TiSi$_2$ or MoSi$_2$ and the like. The first gate electrode 4 may be formed of composite layers, i.e., a metal silicide layer 42 having a high melting point and a doped polysilicon layer 41. The first and/or second gate electrodes may be composed of a single metal layer or a single metal silicide layer having a high melting point.

In the embodiments described above, the contact hole for electrically contacting the first and the second gate electrodes to each other is located in the first gate electrode located just above the active region, i.e., the channel region. However, in order to prevent the active region from being damaged due to etching or other process for forming the contact hole, the contact hole for electrically connecting the first and the second gate electrodes to each other may be formed on the isolation oxide film.

Figure 12:
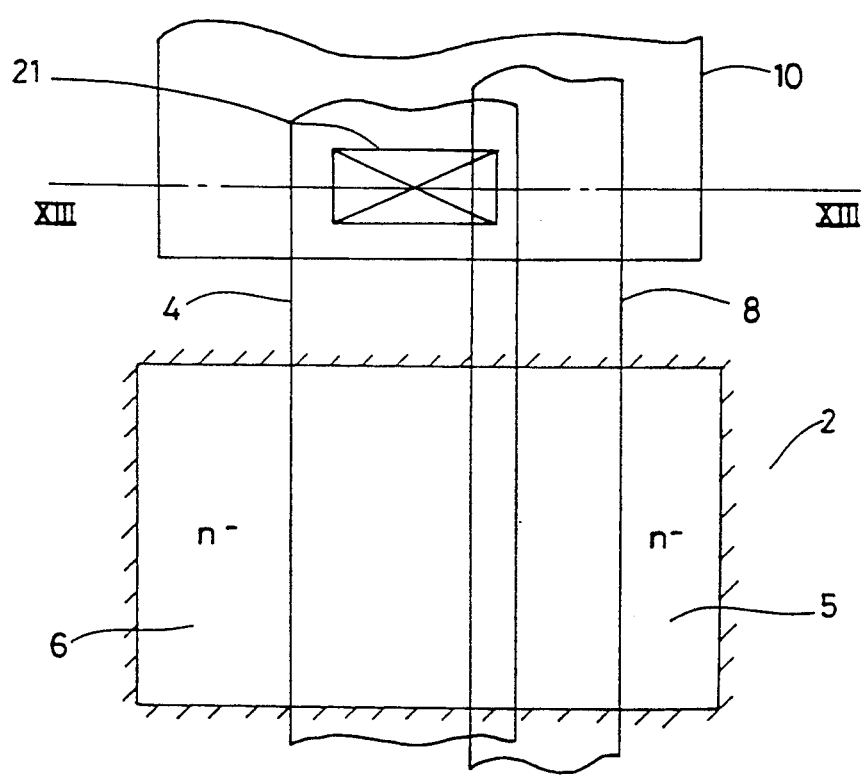
FIG. 12 is a plan view illustrating layout of a contact hole for electrically contacting a first and second gate electrodes to each other.
Figure 13:
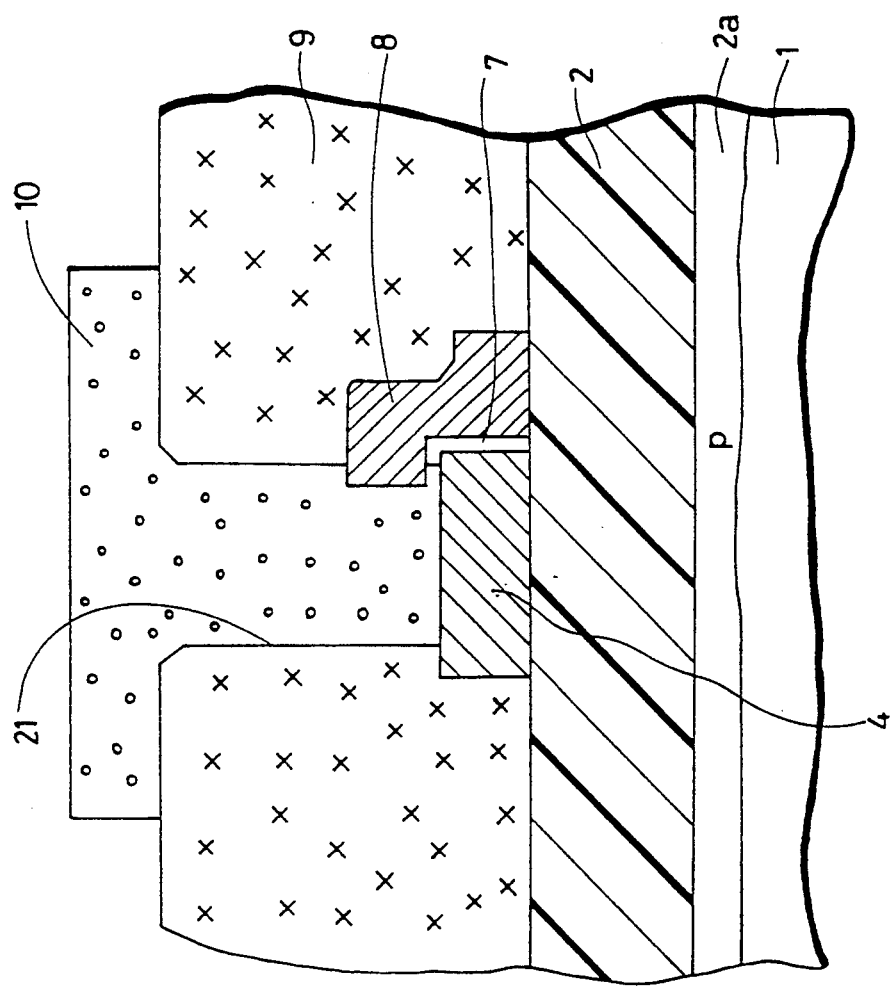
FIG. 13 is a sectional view taken along line XIII—XIII in FIG. 12.

Referring to FIG. 12, an n-channel MOS transistor is formed in an area surrounded by the isolation oxide film. The n-channel MOS transistor comprises first and second gate electrodes 4 and 8 as well as an n$^-$ source region 5 and an n$^-$ drain region 6 spaced from each other by the electrodes 4 and 8. The first and the second gate electrodes 4 and 8 are formed to extend over the isolation oxide film 2. The first and the second gate electrodes 4 and 8 are connected to a gate wired electrode 10 through a contact hole 21 formed on the isolation oxide film 2. As shown in FIG. 13, the first and the second gate electrodes 4 and 8 are formed on the isolation oxide film 2. A layer insulating film 9 is formed on the isolation oxide film 2. The contact hole 21 is formed by etching or the like on the layer insulating film 9 so as to expose at least the surfaces of the first and the second gate electrodes 4 and 8 on the isolation oxide film 2. The gate wired electrode 10 is formed to be electrically in contact with the first and the second gate electrodes 4 and 8 through this contact hole 21.

In the embodiments described above, although the n-channel MOS transistor is formed in the p-type substrate or the p-type well layer, a p-type channel MOS transistor may be formed on an n-type substrate or an n-type well layer, in which case a field effect transistor having an improved resistance to the hot carriers and the increased current drive capacity can also be obtained. Further, although the embodiments described above employ the n$^+$ doped polysilicon as material for the first and the second gate electrodes, p$^+$ doped polysilicon may be used. In the above embodiments, although the second gate insulating film is composed of the silicon oxide film, it is required only to be constructed as the dielectric film and thus it may be formed of material same as that of the first gate insulating film or may be formed of material having a dielectric constant different from that of the first gate insulating film.

Figure 14:
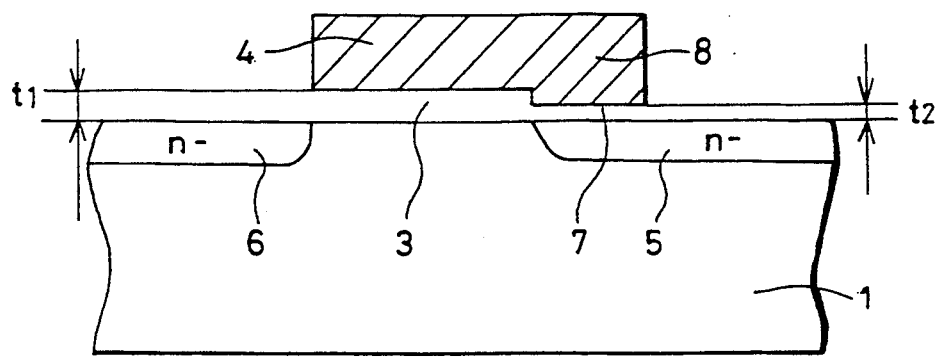
FIG. 14 is a sectional view conceptionally showing the structure of an n channel MOS transistor in accordance with the invention.

FIG. 14 is a sectional view conceptually showing a structure of an n-channel MOS transistor in accordance with the invention. As shown in FIG. 14, a first gate electrode 4 and a second gate electrode 8 are formed in an integral manner. A first gate insulating film 3 is formed to have a thickness of t1 and a second gate insulating film 7 is formed to have a thickness of t2. The second gate electrode 8 is formed to overlap a portion of an n⁻ source region 5 with the second gate insulating film 7 interposed therebetween. An n⁻ drain region 6 is formed on the side of the first gate electrode 4. Preferably, the first gate insulating film 3 and the second gate insulating film 7 are formed so that the thickness t1 may be larger than the thickness t2.

Figure 15:
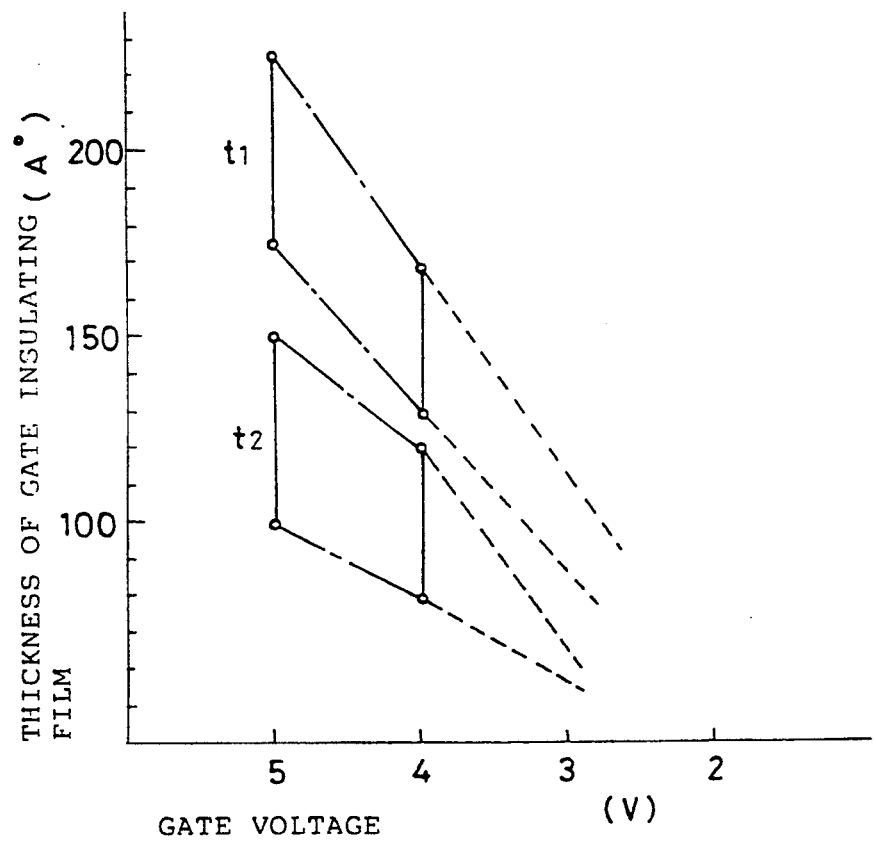
FIG. 15 is a graph showing the relationship between a gate voltage applied to the n channel MOS transistor and a thickness of a gate insulating film in accordance with the invention.
Figure 16:
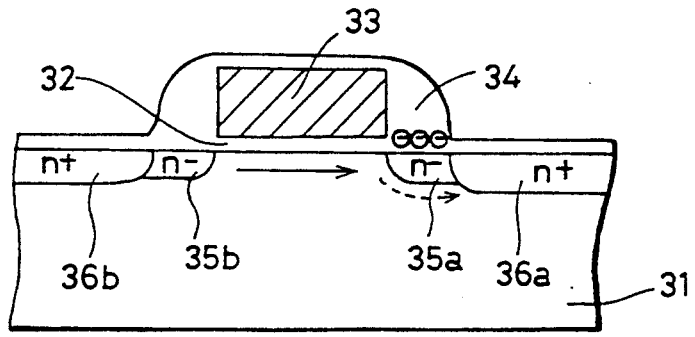
FIG. 16 is a sectional view illustrating a field effect transistor having a conventional LDD structure.
Figure 17:
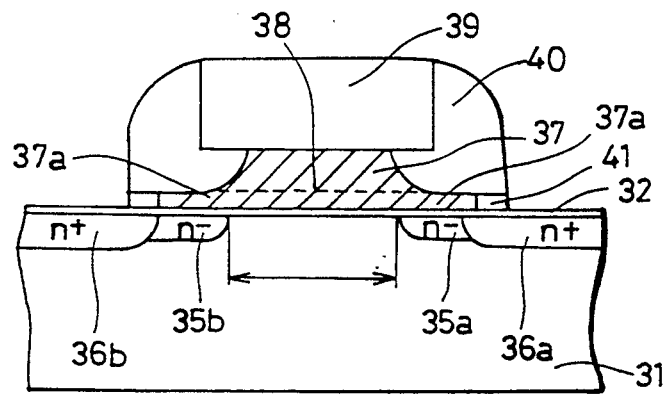
FIG. 17 is a sectional view illustrating a field effect transistor of a prior art having a GOLD structure.
Figure 18:
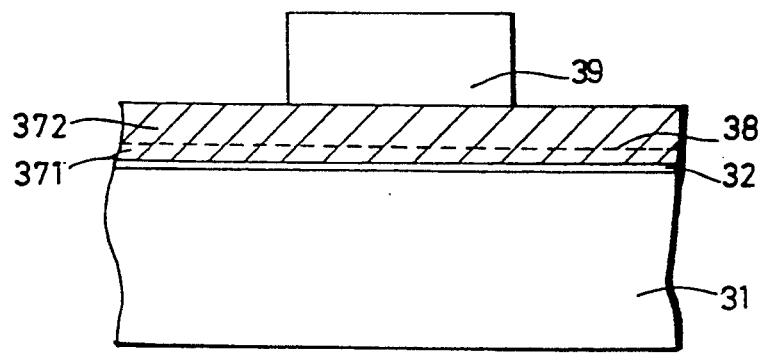
FIGS. 18, 19, 20 and 21 are sectional views showing a manufacturing method of a field-effect transistor having a GOLD structure in order of process.
Figure 19:
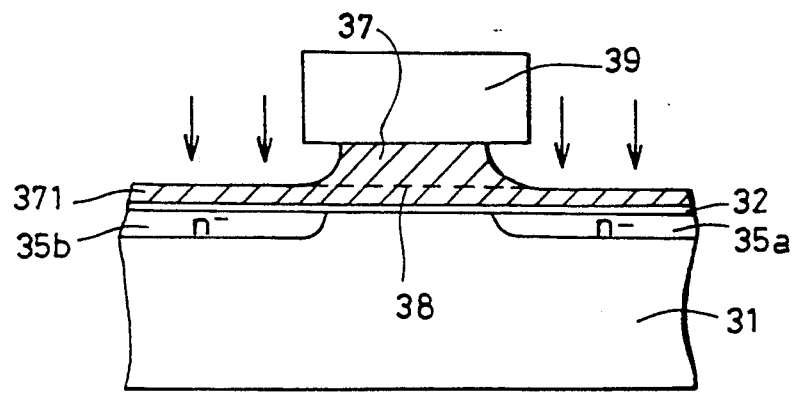
Figure 20:
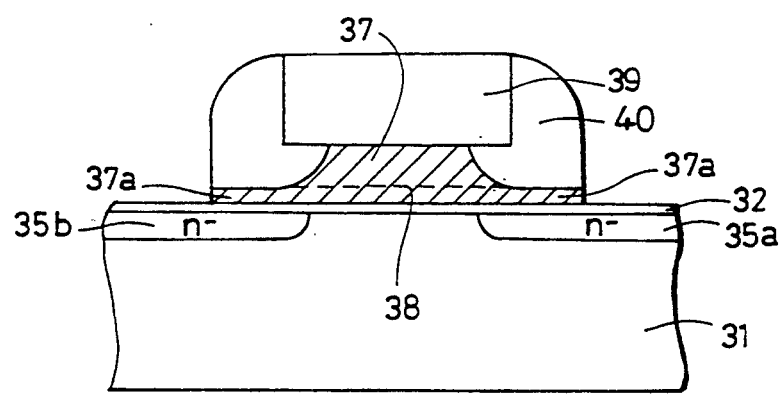
Figure 21:
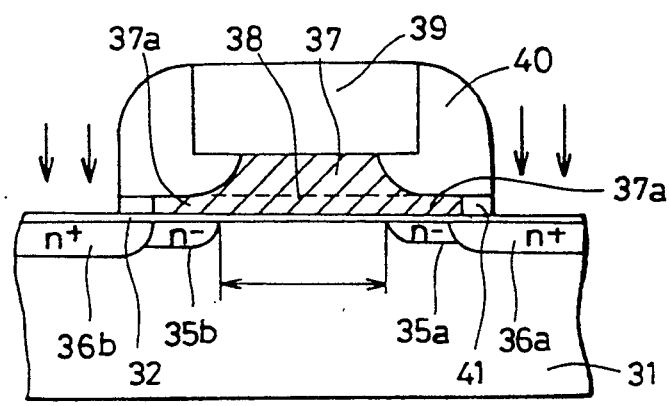

FIG. 15 is a graph showing the relationship between a gate voltage (V) and a thickness of a gate insulating film (Å). As shown in FIG. 15, a thickness t1 of the first gate insulating film and a thickness t2 of the second gate insulating film are changed in accordance with a voltage applied to the first gate electrode and the second gate electrode. When the gate voltage is 5 V, the thickness t1 of the first gate insulating film is selected in the range of 175 to 225 Å and the thickness t2 of the second gate insulating film is selected in the range of 100 to 150 Å. When the gate voltage is 4 V, the thickness t1 of the first gate insulating film is selectedly in the range of 130 to 170 Å and the thickness t2 of the second gate insulating film is selected in the range of 80 to 120 Å. In this way, as the applied gate voltage becomes smaller with miniaturization of a field-effect transistor, the thicknesses of the first gate insulating film and the second gate insulating film are set to a small value, accordingly. A field-effect transistor can be thereby implemented, having a desired current drive capacity in accordance with miniaturization of a field-effect transistor.

According to the invention, as described hereinabove, the second gate electrode advantageously contributes to substantially increase the carrier concentration in the surface of the source region. This enables the high channel conductance with the lower dose, resulting in improvement of the current drive capacity. Further, the resistance to the hot carriers can be made high when the drain region includes an impurity region having a low impurity concentration substantially similar to that of the conventional LDD structure. In the field effect transistor having the gate length of a quarter micron order or below, the effective channel length is not reduced below it. Therefore, a microminiaturized field effect transistor can be implemented, having the large resistance to the hot carriers, and also having the high current drive capacity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having a main surface and containing impurity of a first conduction type in a first concentration;
    a source region and a drain region formed and spaced on the main surface of said semiconductor substrate, and containing impurity of a second conductive type in a second concentration 10 to $10^3$ times greater than said first concentration;
    a first gate electrode located between said source and drain regions and formed on the main surface of said semiconductor substrate with a first insulating film therebetween, said first insulating film having a first thickness and being of a first dielectric constant;
    a second gate electrode having (i) a first portion overlapping a portion of said source region with a second insulating film formed therebetween (ii) and a second portion overlapping a portion of said first gate electrode with a third insulating film formed therebetween, said second insulating film having a second thickness less than said first thickness and being of a second dielectric constant different from said first dielectric constant;
    an insulator layer formed on the main surface of said semiconductor substrate over said first and second gate electrodes with an opening through which surfaces of at least the overlapping portion of said first and second gate electrodes are exposed; and
    a conductive layer in electrical contact with the surfaces of said first and second gate electrodes through said opening.

2. The semiconductor device according to claim 1, further comprising an element isolation region formed on the main surface of said semiconductor substrate, said first gate electrode and said second gate electrode being formed to extend over said element isolation region, and said opening being formed on said element isolation region.

3. The semiconductor device according to claim 1, wherein said source region includes a first source region containing said impurity of the second conductive type in said second concentration, and a second source region formed on a side of said first source region opposite said first gate electrode, said second source region containing the impurity of the second conductive type in a third concentration $10^3$ to $10^5$ times greater than said first concentration.

4. The semiconductor device according to claim 3, wherein said first portion of said second gate electrode is over said first source region, and said second source region connects to said first source region and extends away from said first gate electrode.

5. The semiconductor device according to claim 3, wherein said drain region includes a first drain region containing the impurity of the second conductive type in said second concentration, and a second drain region containing the impurity of the second conductive type in said third concentration.

6. A semiconductor device comprising:
    a semiconductor substrate having a main surface and containing impurity of a first conductive type;
    a source region and a drain region formed in the main surface of said semiconductor substrate on opposite sides of a channel region, said source and drain regions containing impurity of a second conductive type;
    a first insulation film having a first dielectric constant formed on the main surface of said semiconductor substrate over said channel region;
    a first gate electrode formed on said first insulating film over said channel region;
    a second insulating film having a second dielectric constant, different from said first dielectric constant, formed on the main surface of said semiconductor substrate over said source region; and
    a second gate electrode formed on said second insulating film over said source region, said second gate electrode electrically connected to said first electrode.

7. The semiconductor device according to claim 6, further comprising a third insulating layer formed between said first and second gate electrodes.

8. The semiconductor device according to claim 6, wherein thickness of said first insulating film is within the range of 175 to 225 Å and thickness of said second insulating film is within the range of 100 to 150 Å.

9. The semiconductor device according to claim 6, wherein thickness of said first insulating film is within the range of 130 to 170 Å and thickness of said second insulating film is within the range of 80 to 120 Å.

10. The semiconductor device according to claim 6, wherein said second gate electrode includes a first layer of polysilicon and a second layer of a metal silicide.

11. The semiconductor device according to claim 6, wherein said first gate electrode includes a first layer of polysilicon and a second layer of a metal silicide.

12. The semiconductor device according to claim 6, wherein
the thickness of said first insulation film is greater than that of said second insulating film.

13. A semiconductor device, comprising:
a semiconductor substrate having a main surface and containing impurity of a first conductivity type;
a source region and a drain region formed in the main surface of said semiconductor substrate on opposite sides of a channel region, said source and drain regions containing impurity of a second conductivity type;
a first insulating film formed on the main surface of said semiconductor substrate over said channel region;
a first gate electrode formed on said first insulating film over said channel region;
a second insulating film formed on a side surface of said first gate electrode adjacent said source region and on the main surface of said semiconductor substrate over said source region; and
a second gate electrode formed on said second insulating film over said source region, said second gate electrode having a portion overlying said first gate electrode, being insulated laterally from said first gate electrode, and being electrically connected to said first gate electrode only at said overlying portion.

14. The semiconductor device according to claim 13, further comprising
a conductive layer electrically connecting said first gate electrode to said second gate electrode only at the overlying portion.

15. The semiconductor device according to claim 13, wherein
said first insulating film has a first thickness and said second insulating film has a second thickness less than said first thickness.

16. The semiconductor device according to claim 13, wherein
said first insulating film is of a first dielectric constant and said second insulating film is of a second dielectric constant different from said first dielectric constant.

* * * * *